(12) United States Patent
Nagaoka

(10) Patent No.: US 12,606,911 B2
(45) Date of Patent: Apr. 21, 2026

(54) SHOWER HEAD, SUBSTRATE PROCESSING APPARATUS, AND SUBSTRATE PROCESSING METHOD

(71) Applicant: Tokyo Electron Limited, Tokyo (JP)

(72) Inventor: Hideki Nagaoka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 49 days.

(21) Appl. No.: 18/667,069

(22) Filed: May 17, 2024

(65) Prior Publication Data

US 2024/0401200 A1     Dec. 5, 2024

(30) Foreign Application Priority Data

May 31, 2023     (JP) ................................. 2023-090300

(51) Int. Cl.
*C23C 16/455*     (2006.01)
*C23C 16/44*     (2006.01)
*H01J 37/32*     (2006.01)

(52) U.S. Cl.
CPC .... *C23C 16/45574* (2013.01); *C23C 16/4405* (2013.01); *C23C 16/45544* (2013.01); *C23C 16/45565* (2013.01); *H01J 37/32449* (2013.01); *H01J 37/32862* (2013.01)

(58) Field of Classification Search
CPC .......... C23C 16/45574; C23C 16/4405; C23C 16/45544; C23C 16/45565; C23C 16/45568; C23C 16/4557; H01J 37/32449; H01J 37/32862; H01J 37/32834
See application file for complete search history.

(56) References Cited

U.S. PATENT DOCUMENTS 5,624,498 A * 4/1997 Lee ................... C23C 16/45574
                                                        118/725
5,871,586 A * 2/1999 Crawley ........... C23C 16/45514
                                                        118/724
6,086,677 A * 7/2000 Umotoy ............ C23C 16/45565
                                                        118/724

(Continued)

FOREIGN PATENT DOCUMENTS

CN        209298073 U   *  8/2019
JP        2004179426 A   *  6/2004   ........ H01J 37/32862

(Continued)

*Primary Examiner* — Jeffrie R Lund
(74) *Attorney, Agent, or Firm* — IPUSA, PLLC

(57)     ABSTRACT

A shower head includes a first diffusion chamber spreading inside a structure in a direction perpendicular to a thickness direction to diffuse a first gas, a second diffusion chamber provided independent of and adjacent to the first diffusion chamber in the thickness direction of the structure to diffuse a second gas, cylinders disposed in the first diffusion chamber and having holes communicating with the second diffusion chamber, first discharge ports in a discharge surface of the structure and communicating with the first diffusion chamber to discharge the first gas, and second discharge ports in the discharge surface at positions different from the first discharge ports and communicating with the holes to discharge the second gas. A central supply chamber of the structure supplies a radicalized third gas, and a third discharge port in a center of the discharge surface communicates with the central supply chamber to discharge the third gas.

9 Claims, 7 Drawing Sheets

(56) References Cited

U.S. PATENT DOCUMENTS

| | | | | |
|---|---|---|---|---|
| 6,663,715 B1 * | 12/2003 | Yuda | | C23C 16/45519 |
| | | | | 156/345.47 |
| 6,800,139 B1 * | 10/2004 | Shinriki | | C23C 16/45576 |
| | | | | 156/345.33 |
| 7,354,622 B2 * | 4/2008 | Shinriki | | C23C 16/4557 |
| | | | | 118/724 |
| 7,931,749 B2 * | 4/2011 | Amikura | | C23C 16/45565 |
| | | | | 156/345.33 |
| 8,152,923 B2 * | 4/2012 | Mitrovic | | C23C 16/45565 |
| | | | | 156/345.33 |
| 8,303,713 B2 * | 11/2012 | Belousov | | C23C 16/45574 |
| | | | | 156/345.33 |
| 8,551,288 B2 * | 10/2013 | Kim | | H01L 21/31138 |
| | | | | 156/345.33 |
| 8,679,252 B2 * | 3/2014 | Shih | | H01J 37/32633 |
| | | | | 118/724 |
| 8,721,791 B2 * | 5/2014 | Tiner | | B05B 1/005 |
| | | | | 156/345.33 |
| 8,882,913 B2 * | 11/2014 | Byun | | C23C 16/45572 |
| | | | | 118/724 |
| 9,017,481 B1 * | 4/2015 | Pettinger | | H01J 37/32449 |
| | | | | 118/724 |
| 9,315,897 B2 * | 4/2016 | Byun | | C23C 16/45572 |
| 9,587,312 B2 * | 3/2017 | Silva | | C23C 16/45574 |
| 9,679,749 B2 * | 6/2017 | Angelov | | C23C 16/4411 |
| 10,062,585 B2 * | 8/2018 | Lubomirsky | | H01J 37/32715 |
| 2004/0050328 A1 * | 3/2004 | Kumagai | | C23C 16/45574 |
| | | | | 427/574 |
| 2004/0149212 A1 * | 8/2004 | Cho | | C23C 16/45561 |
| | | | | 118/715 |
| 2005/0155551 A1 * | 7/2005 | Bae | | C23C 16/4481 |
| | | | | 427/248.1 |
| 2005/0158469 A1 * | 7/2005 | Park | | C23C 16/45574 |
| | | | | 118/715 |
| 2005/0233093 A1 * | 10/2005 | Tada | | H01L 21/28562 |
| | | | | 257/E21.171 |
| 2024/0401200 A1 * | 12/2024 | Nagaoka | | C23C 16/45544 |

FOREIGN PATENT DOCUMENTS

| | | | | |
|---|---|---|---|---|
| JP | 4317275 B2 * | 8/2009 | | |
| JP | 2023-025578 | 2/2023 | | |
| KR | 20150145195 A * | 12/2015 | | C23C 16/45565 |
| TW | 201207905 A * | 2/2012 | | H01L 21/20 |
| WO | 2008/007675 | 1/2008 | | |

* cited by examiner

SHOWER HEAD, SUBSTRATE PROCESSING APPARATUS, AND SUBSTRATE PROCESSING METHOD

CROSS-REFERENCE TO RELATED APPLICATIONS

This application is based upon and claims priority to Japanese Patent Application No. 2023-090300, filed on May 31, 2023, the entire contents of which are incorporated herein by reference.

BACKGROUND

1. Field of the Invention

The present disclosure relates to shower heads, substrate processing apparatuses, and substrate processing methods.

2. Description of the Related Art

For example, Japanese Laid-Open Patent Publication No. 2023-25578 proposes a film forming apparatus (a substrate processing apparatus) including a chamber (a processing chamber) configured to accommodate a substrate, and a gas supply configured to supply two kinds of gases to the processing chamber. The gas supply of the substrate processing apparatus is provided with a separate cleaning gas supply source, The cleaning gas supply source is configured to supply a cleaning gas, radicalized by remote plasma, to the processing chamber so as to clean the inside of the processing chamber.

Further, International Publication Pamphlet No. WO 2008/7675 proposes a film forming apparatus (a substrate processing apparatus) configured to perform cleaning by supplying a cleaning gas into a processing chamber. The cleaning gas is diffused in the shower head and discharged into a processing space through a plurality of discharge holes.

SUMMARY

One aspect of embodiments of the present disclosure provides a technique capable of reducing deactivation of a radicalized gas.

According to one aspect of the embodiments of the present disclosure, a shower head includes a structure; a first diffusion chamber, spreading inside the structure in a direction perpendicular to a thickness direction of the structure, configured to diffuse a first gas; a second diffusion chamber, provided inside the structure adjacent to the first diffusion chamber in the thickness direction and independent of the first diffusion chamber, configured to diffuse a second gas; a plurality of cylinders disposed in the first diffusion chamber and having communication holes on inner sides thereof communicating with the second diffusion chamber; a plurality of first discharge ports, provided in a discharge surface of the structure and communicating with the first diffusion chamber, and configured to discharge the first gas; a plurality of second discharge ports, provided in the discharge surface at positions different from the first discharge ports and communicating with the communication holes of the plurality of cylinders, and configured to discharge the second gas; a central supply chamber, provided separately from the first diffusion chamber and the second diffusion chamber at a central portion of the structure in the direction perpendicular to the thickness direction, and configured to supply a radicalized third gas; and one or more third discharge ports, provided in a central portion of the discharge surface and communicating with the central supply chamber, and configured to discharge the third gas.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DETAILED DESCRIPTION

Figure 1:
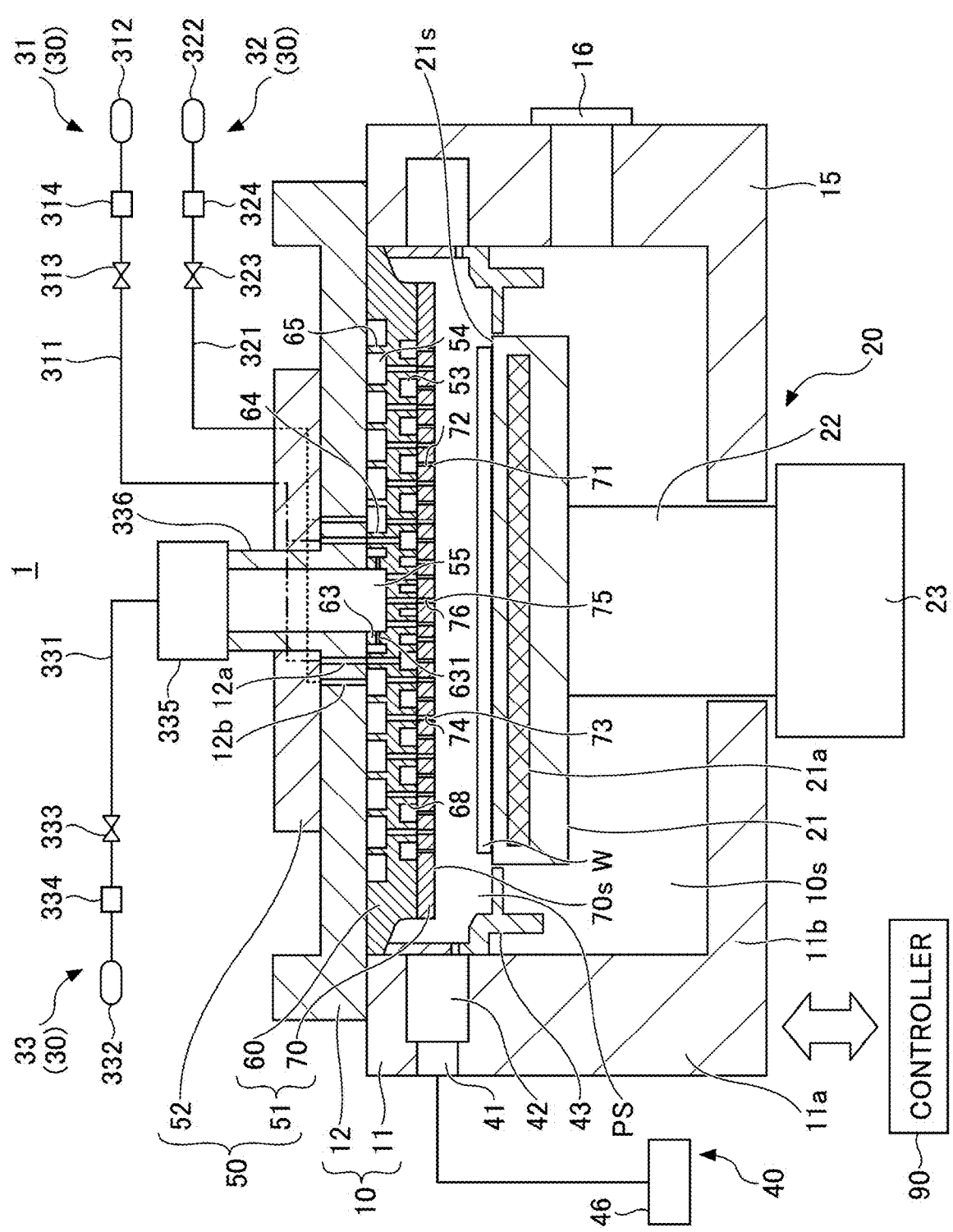
FIG. 1 is a cross sectional view schematically illustrating a substrate processing apparatus having a shower head according to an embodiment.

Hereinafter, embodiments of the present disclosure will be described with reference to the drawings. In the drawings, the same constituent elements are designated by the same reference numerals, and a redundant description thereof may be omitted.

FIG. 1 is a cross sectional view schematically illustrating a substrate processing apparatus 1 having a shower head 50 according to an embodiment. As illustrated in FIG. 1, the substrate processing apparatus 1 is configured to form a film on a surface of a substrate W by chemical vapor deposition (CVD) or atomic layer deposition (ALD). The substrate W to be subjected to a substrate processing may be a semiconductor substrate, such as a silicon wafer, a compound semiconductor wafer, or the like.

More particularly, the substrate processing apparatus 1 includes a processing chamber 10, a substrate support 20, a gas supply 30, a gas exhauster 40, and a shower head 50. The substrate processing apparatus 1 further includes a controller 90 that controls the constituent elements (or components) of the substrate processing apparatus 1 so as to perform the substrate processing.

The processing chamber 10 has an internal space 10s for accommodating and processing the substrate W. For example, the processing chamber 10 includes a chamber body 11 and a lid 12. The chamber body 11 has a concave shape in a cross sectional side view, such that a cylindrical sidewall 11a and a bottom wall 11b are continuously formed. The bottom wall 11b has a shape of a perfect circle. The lid 12 covers an upper opening of the chamber body 11. An upper end of the sidewall 11a and a lower surface of the lid 12 are airtightly fixed to each other with a sealing member (not illustrated) interposed therebetween.

The processing chamber 10 (the chamber body 11 and the lid 12) is formed of a metal material, such as aluminum, aluminum alloy, or the like, for example. The processing chamber 10 is not limited to such a metal material, and a material having a high heat resistance, such as stainless steel, low thermal expansion metal, low thermal expansion alloy (invar), low thermal expansion ceramic (inorganic material), or the like may be used for the processing chamber 10. In addition, the processing chamber 10 may include a heating body (not illustrated) configured to heat the processing chamber 10, provided inside or in a periphery of the chamber body 11 or the lid 12.

The substrate processing apparatus 1 further includes an inlet/outlet 15 through which the substrate W is transported into and extracted from the processing chamber 10, and a gate valve 16 configured to open and close the inlet/outlet 15. The inlet/outlet 15 is provided at a predetermined position of the sidewall 11a of the processing chamber 10.

On the other hand, the substrate support 20 includes a susceptor 21 configured to directly hold the substrate W, a support member 22 configured to support the susceptor 21, and a susceptor operating mechanism 23 configured to support the support member 22 outside the processing chamber 10. The susceptor 21 is formed of a metal, such as aluminum, nickel, or the like, and is supported by the support member 22 inside the processing chamber 10. The susceptor 21 is formed to have a shape of a perfect circle slightly larger than the substrate W, and has a placement surface 21s for supporting the substrate W in a horizontal state is provided on an upper surface of the susceptor 21. A temperature adjuster 21a configured to adjust a temperature of the substrate W placed on the placement surface 21s is provided in the susceptor 21. The temperature adjuster 21a is configured by combining a flow passage through which a temperature adjustment fluid flows, a heater, or the like, and adjusts the temperature of the substrate W under a control of the controller 90.

The support member 22 is connected to a center of a bottom surface of the susceptor 21. The support member 22 extends downward from the processing chamber 10 through a hole penetrating the bottom wall 11b of the processing chamber 10, and a lower end of the support member 22 is connected to the susceptor operating mechanism 23.

The susceptor operating mechanism 23 includes functions of raising and lowering the susceptor 21 and rotating the susceptor 21, via the support member 22. More particularly, the susceptor operating mechanism 23 moves the susceptor 21 between a processing position where the substrate W is processed, and a transport position where the substrate W is received and transported below the processing position. When the susceptor 21 is raised to the processing position, a processing space PS for substrate processing is formed between the shower head 50 and the susceptor 21 in the internal space 10s of the processing chamber 10. In addition, the susceptor operating mechanism 23 rotates the susceptor 21 during the substrate processing of the substrate W.

Moreover, the substrate support 20 includes a pin elevator mechanism configured to raise and lower a plurality of support pins (not illustrated). The raising and lowering of the plurality of pins by the pin elevator mechanism is controlled by the controller 90 in a state where the susceptor 21 is moved to the transport position by the susceptor operating mechanism 23, so that the substrate W is received and transported between the substrate support 20 and a transport device (not illustrated) that moves back and forth through the inlet/outlet 15.

The gas supply 30 supplies a plurality of kinds of gases from the outside of the processing chamber 10 to the internal space 10s (a processing space PS) of the processing chamber 10 through the shower head 50. The types of gases supplied by the gas supply 30 are selected appropriately according to the type of film to be formed on the substrate W. In the present embodiment, the substrate processing apparatus 1 forms a polyurea film on the surface of the substrate W by the substrate processing. In this case, the gas supply 30 supplies a gas (a first gas: hereinafter also referred to as "a source gas") of an isocyanate group compound as a processing gas to be adsorbed onto the substrate W, and a gas (a second gas: hereinafter also referred to as "a reaction gas") of an amine group compound as a processing gas to react with the source gas. Further, the gas supply 30 supplies a gas (a third gas: hereinafter also referred to as "a cleaning gas"), such as $O_2$, $O_3$, or the like as a processing gas for cleaning the inside of the processing chamber 10. The film formed on the substrate W is not limited to the polyurea film, and may be a metal film, a metal oxide film, a metal nitride film, a silicon film, a silicon oxide film, a silicon nitride film, or the like.

The gas supply 30 supplies three kinds of gases (the source gas, the reaction gas, and the cleaning gas) at appropriate timings under the control of the controller 90. For this reason, the gas supply 30 includes a source gas supply 31, a reaction gas supply 32, and a cleaning gas supply 33 which are separately connected to the shower head 50.

The source gas supply 31 includes a source gas supply passage (or channel) 311 connected to the shower head 50. In addition, the source gas supply 31 includes a source gas source 312 located at an upstream end of the source gas supply passage 311, and a valve 313 and a flow rate adjuster 314 located at intermediate positions of the source gas supply passage 311. When supplying the source gas, the controller 90 opens the valve 313 to supply the source gas from the source gas source 312 to the source gas supply passage 311, and controls the flow rate adjuster 314 to adjust the flow rate of the source gas supplied to the shower head 50.

The reaction gas supply 32 includes a reaction gas supply passage (or channel) 321 connected to the shower head 50. In addition, the reaction gas supply 32 includes a reaction gas source 322 located at an upstream end of the reaction gas supply passage 321, and a valve 323 and a flow rate adjuster 324 located at intermediate positions of the reaction gas supply passage 321. When supplying the reaction gas, the controller 90 opens the valve 323 to supply the reaction gas from the reaction gas source 322 to the reaction gas supply passage 321, and controls the flow rate adjuster 324 to adjust the flow rate of the reaction gas supplied to the shower head 50.

The cleaning gas supply 33 includes a cleaning gas supply passage (or channel) 331 connected to the shower head 50. In addition, the cleaning gas supply 33 includes a cleaning gas source 332 located at an upstream end of the cleaning gas supply passage 331, and a valve 333, a flow rate adjuster 334, and a remote plasma device 335 located at intermediate positions of the cleaning gas supply passage 331. When supplying the cleaning gas, the controller 90 opens the valve 333 to supply the reaction gas from the cleaning gas source 332 to the cleaning gas supply passage 331, and controls the flow rate adjuster 334 to adjust the flow rate of the cleaning gas.

The remote plasma device 335 is configured to perform a process of radicalizing the cleaning gas outside the processing chamber 10. For example, the remote plasma device 335 guides microwave generated by a microwave generator (not illustrated) to a plasma generation chamber (not illustrated) communicating with the cleaning gas supply passage 331 through a waveguide, and radicalizes the cleaning gas supplied thereto by the microwave. Further, the remote plasma device 335 causes the cleaning gas radicalized in the plasma generation chamber to flow into an introduction pipe 336 provided at a central portion of the lid 12, and supplies the radicalized cleaning gas to the shower head 50 through the introduction pipe 336.

The gas supply 30 may be configured to supply another kind of gas, such as a purge gas or the like, in addition to the three kinds of gases described above. For example, a purge gas supply passage is connected from a purge gas source (not illustrated) to the source gas supply passage 311, the reaction gas supply passage 321, and the cleaning gas supply passage 331. The gas supply 30 supplies the purge gas to the shower head 50 through these supply passages, under the control of the controller 90.

The gas exhauster 40 exhausts, as an exhaust gas, an unreacted gas supplied to the internal space 10s of the processing chamber 10, a reaction product by the reaction of the gases, or the like. In particular, the gas exhauster 40 according to the present embodiment is configured to uniformly exhaust the exhaust gas above and in a circumferential direction of the substrate W from the entire circumference.

More particularly, the gas exhauster 40 includes an exhaust port 41 and an annular exhaust groove 42 communicating with the exhaust port 41, provided at an upper side of the sidewall 11a of the processing chamber 10 (the chamber body 11). In addition, the gas exhauster 40 includes a baffle structure 43 surrounding an inner side of the exhaust groove 42 and having a plurality of holes communicating with the exhaust groove 42. The exhaust groove 42 is provided at a position higher than the substrate W disposed at the processing position by the substrate support 20. The gas exhauster 40 guides the exhaust gas in the processing space PS upward through the baffle structure 43.

The gas exhauster 40 includes an exhaust passage 45 connected to the exhaust port 41 outside the processing chamber 10, and a suction mechanism 46 configured to suck the exhaust gas into the exhaust passage 45. The suction mechanism 46 is configured by an appropriate combination of an automatic pressure control (APC) valve for adjusting the pressure inside the processing chamber 10, a turbo molecular pump for sucking the processing gas, a vacuum pump, or the like, for example. The suction mechanism 46 operates under the control of the controller 90 to apply a negative pressure for guiding the exhaust gas inside the processing chamber 10. Accordingly, the exhaust gas existing in the processing space PS during the substrate processing flows into the exhaust groove 42 through the holes of the baffle structure 43, moves from the exhaust groove 42 to the exhaust port 41, and flows out to the exhaust passage 45. The exhaust gas is discharged from the exhaust passage 45 to a disposal device (not illustrated) through the suction mechanism 46.

On the other hand, the shower head 50 of the substrate processing apparatus 1 is fixed to the lid 12, and supplies the gases supplied from the gas supply 30 to the processing space PS (the internal space 10s) of the processing chamber 10. The shower head 50 includes a main structure 51 fixed to the lower surface of the lid 12, and an introduction structure 52 fixed to an upper surface of the lid 12. That is, the main structure 51 is disposed inside the processing chamber 10, and the introduction structure 52 is disposed outside the processing chamber 10.

During the substrate processing, the main structure 51 diffuses and supplies the source gas and the reaction gas to the substrate W placed on the susceptor 21 inside the processing chamber 10. In addition, during the cleaning process in which the inside of the processing chamber 10 is cleaned, the main structure 51 supplies the radicalized cleaning gas from the central portion of the processing chamber 10 (the lid 12), so as to clean the susceptor 21 and a periphery of the susceptor 21.

More particularly, the main structure 51 is configured to have a laminated configuration in which two members (a diffusion chamber member 60 and a discharge member 70) formed to have a disk shape are assembled in a vertical direction. The diffusion chamber member 60 forms a diffusion chamber for the source gas and a diffusion chamber for the reaction gas, that are separated from each other, by laminating the lid 12 and the discharge member 70. The discharge member 70 is disposed at a position closer to the susceptor 21 than the diffusion chamber member 60 is to the susceptor 21, and is used to discharge the various gases. The main structure 51 is not limited to the configuration in which two members are assembled, and may be integrally formed as a single member by performing three dimensional modeling (an additive manufacturing, for example) using a modeling apparatus (not illustrated) or the like.

In a state where the lid 12, the diffusion chamber member 60, and the discharge member 70 are assembled, the main structure 51 forms therein a first diffusion chamber 53 for diffusing the source gas, and a second diffusion chamber 54 for diffusing the reaction gas. The first diffusion chamber 53 and the second diffusion chamber 54 are located adjacent to each other in the vertical direction, but are provided independently of each other (not in communication with each other). More particularly, the first diffusion chamber 53 is disposed on the lower side than the second diffusion chamber 54 in the vertical direction.

The first diffusion chamber 53 is formed by a surface of the diffusion chamber member 60 on a side (a lower side in the vertical direction) opposing the discharge member 70 and in contiguous contact with the discharge member 70. The first diffusion chamber 53 spreads inside the main structure 51 in a horizontal direction perpendicular to a thickness direction (the vertical direction) of the main structure 51. The source gas is supplied to the first diffusion chamber 53 through supply holes 641 of a plurality of supply cylinders 64 formed in the diffusion chamber member 60. The first diffusion chamber 53 diffuses the supplied source gas by causing the source gas to flow in the horizontal direction.

The second diffusion chamber 54 is formed by a surface of the diffusion chamber member 60 on a side (an upper side in the vertical direction) opposing the lid 12 and in contiguous contact with the lid 12. The second diffusion chamber 54 spreads inside the main structure 51 in the horizontal direction perpendicular to the thickness direction (the vertical direction) of the main structure 51. The reaction gas is supplied to the second diffusion chamber 54 through a plurality of second lid-side flow passages 12b formed in the lid 12. The second diffusion chamber 54 diffuses the supplied reaction gas by causing the reaction gas to flow in the horizontal direction.

However, a central portion of the main structure 51 (the diffusion chamber member 60) in the horizontal direction forms a central supply chamber 55 for supplying the cleaning gas, separately from the second diffusion chamber 54. The central supply chamber 55 communicates with a flow passage of the introduction pipe 336 provided at the central portion of the lid 12, and the cleaning gas is supplied from the introduction pipe 336.

Figure 2:
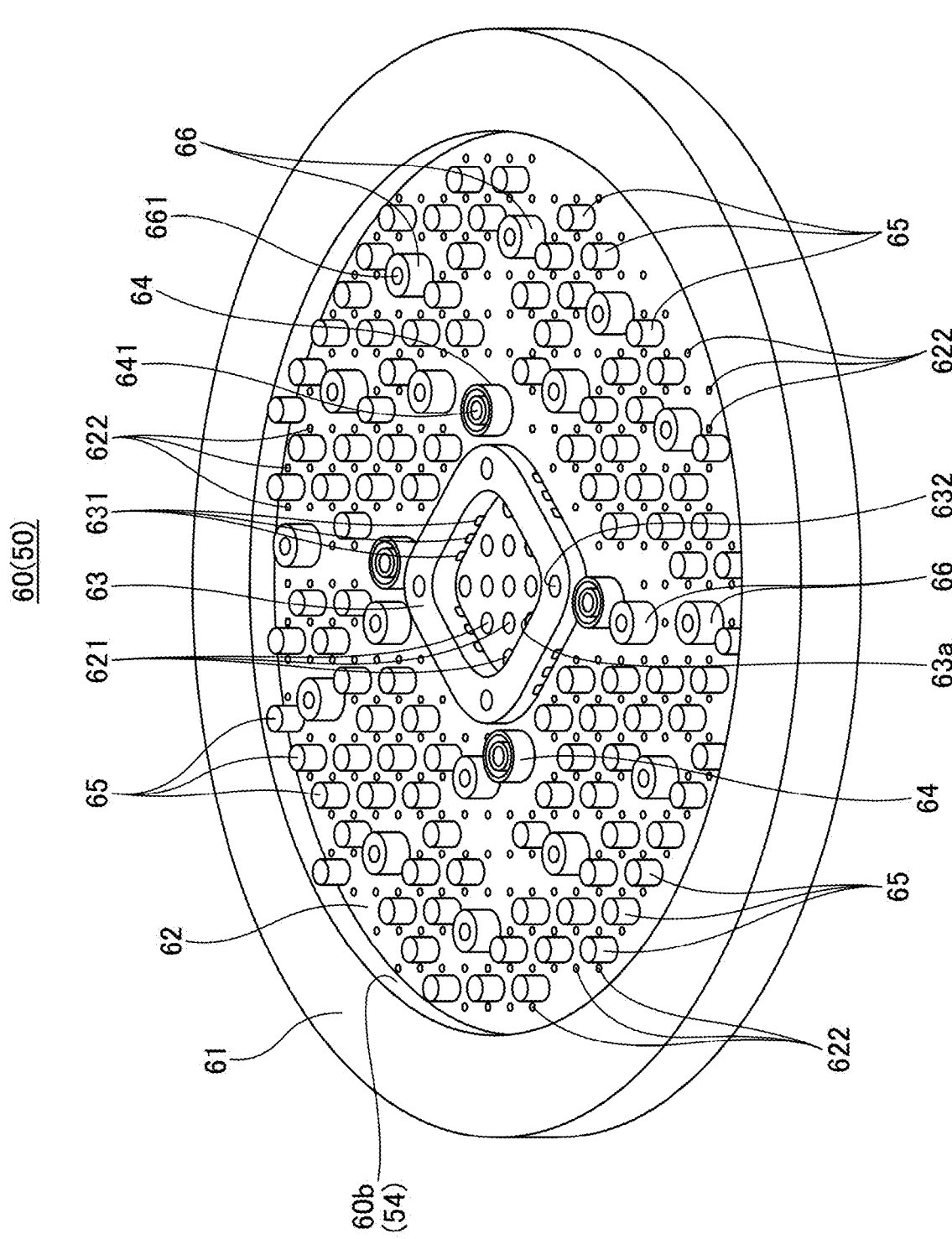
FIG. 2 is a perspective view illustrating an upper side in a vertical direction of a diffusion chamber member forming a second diffusion chamber.
Figure 3:
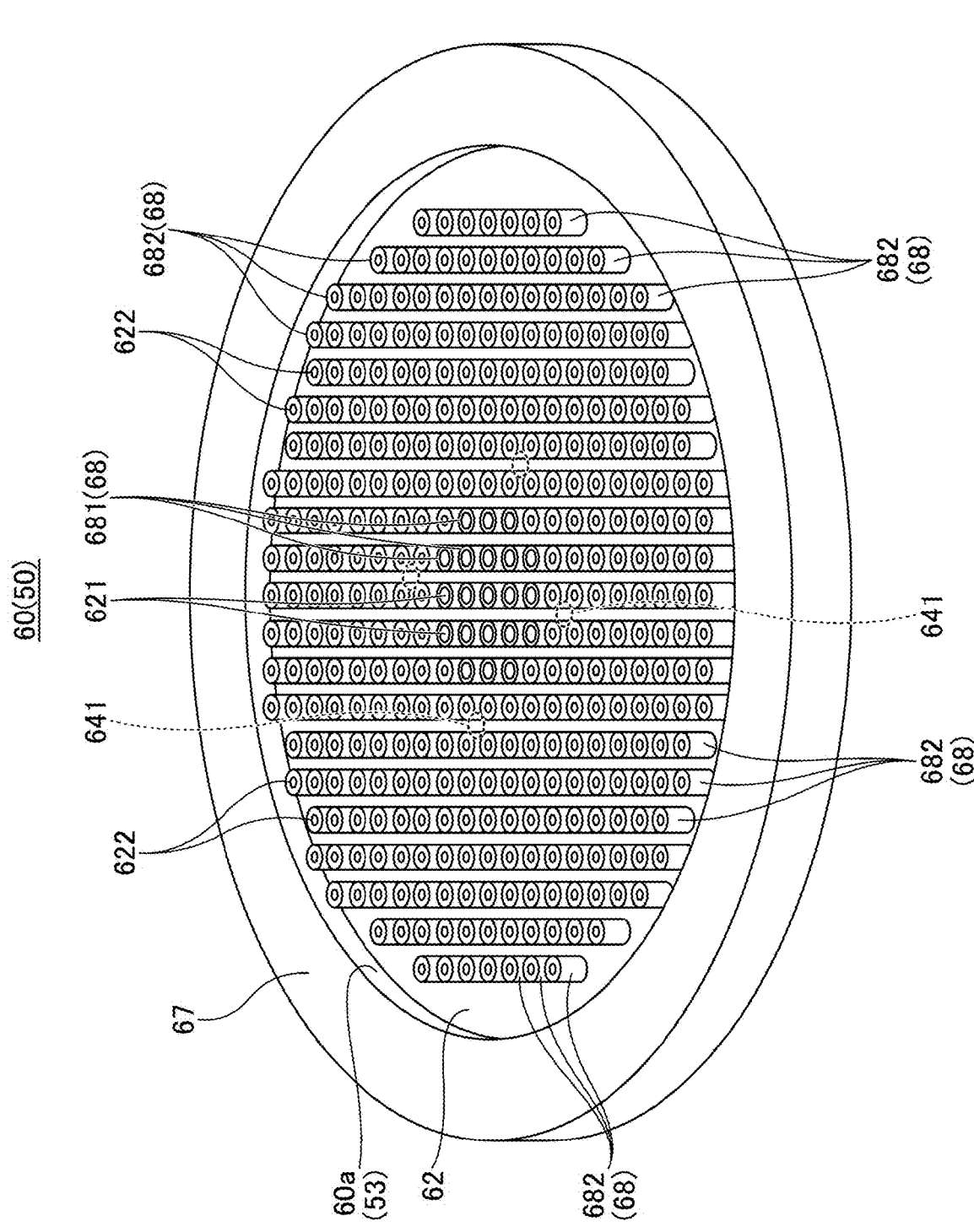
FIG. 3 is a perspective view illustrating a diffusion chamber member forming a first diffusion chamber, with a lower side the diffusion chamber member in the vertical direction turned upside down.

Hereinafter, a specific configuration of the diffusion chamber member 60 forming the first diffusion chamber 53, the second diffusion chamber 54, and the central supply chamber 55 will be described, with reference to FIG. 2 and FIG. 3. FIG. 2 is a perspective view illustrating the upper side in the vertical direction of the diffusion chamber member 60 forming the second diffusion chamber 54. FIG. 3 is a perspective view illustrating the diffusion chamber member 60 forming the first diffusion chamber 53, with the lower side the diffusion chamber member 60 in the vertical direction turned upside down.

As illustrated in FIG. 2, the diffusion chamber member 60 has a second diffusion chamber recess 60*b* in the surface on the upper side in the vertical direction. The second diffusion chamber recess 60*b* forms the second diffusion chamber 54 by fixing (sealing) the diffusion chamber member 60 to the lid 12. The second diffusion chamber recess 60*b* is formed by an outer edge portion 61 of the diffusion chamber member 60 having an annular shape and surrounding the second diffusion chamber recess 60*b*, and a bottom portion 62 that extends in a middle along the thickness direction of the diffusion chamber member 60. An upper surface (a protruding end surface) of the outer edge portion 61 is formed to have a flat shape that can make surface contact with the lid 12. Although not illustrated, the outer edge portion 61 is provided with a plurality of screw holes along the circumferential direction thereof, and the plurality of screw holes are used for screwing the outer edge portion 61 and the lid 12 together. Moreover, a seal member (not illustrated) may be disposed between the lid 12 and the outer edge portion 61, so that airtightness may be enhanced by sandwiching the seal member between the lid 12 and the outer edge portion 61.

Further, the diffusion chamber member 60 includes a partition wall 63 having an endless shape, a plurality of supply cylinders 64, a plurality of heat transfer protrusions 65, and a plurality of fixing cylinders 66 on the bottom portion 62 inside the second diffusion chamber recess 60*b*. The partition wall 63, the supply cylinders 64, the heat transfer protrusions 65, and the fixing cylinders 66 are formed to have the same height as the upper surface of the outer edge portion 61 from the bottom portion 62, respectively (the heights thereof are the same). Accordingly, in a state where the lid 12 and the outer edge portion 61 make contact with each other, the partition wall 63, the supply cylinders 64, the heat transfer protrusions 65, and the fixing cylinders 66 make contact with the lower surface of the lid 12.

The partition wall 63 is provided at the central portion of the second diffusion chamber recess 60*b*, and partitions the second diffusion chamber 54 and the central supply chamber 55 from each other. A supply chamber recess 63*a* is formed on an inner side of the partition wall 63. The supply chamber recess 63*a* forms the central supply chamber 55 when the diffusion chamber member 60 is fixed to the lid 12.

In a plan view, the partition wall 63 is formed to have a substantially rectangular shape having rounded corners with a large radius of curvature. A plurality of screw holes 632 for screwing the partition wall 63 and the lid 12 together are provided in an upper surface of the partition wall 63 along the circumferential direction thereof. A plurality of central holes 621 for causing the cleaning gas in the central supply chamber 55 to flow downward in the vertical direction are provided in the bottom portion 62 forming the supply chamber recess 63*a*. The central holes 621 are disposed in a matrix arrangement, for example, and are surrounded by the partition wall 63 in the plan view.

Further, the partition wall 63 has a plurality of horizontal holes 631 communicating the second diffusion chamber recess 60*b* and the supply chamber recess 63*a*. Each of the horizontal holes 631 extends in the horizontal direction, and is set to a flow passage cross sectional area smaller than a flow passage cross sectional area of each of the central holes 621. Each of the horizontal holes 631 enables the reaction gas to move from the second diffusion chamber recess 60*b* toward the supply chamber recess 63*a*.

Each of the supply cylinders 64 enables the source gas supplied through the lid 12 to flow to the first diffusion chamber 53. Each of the supply cylinders 64 has the supply hole 641 extending along an axial direction (the vertical direction) on the inner side thereof. Each of the supply holes 641 penetrates the bottom portion 62 of the diffusion chamber member 60, and communicates with the first diffusion chamber 53. Each of the supply holes 641 is formed to have a diameter greater than (or equal to) a diameter of each of the central holes 621.

Because each of the heat transfer protrusions 65 makes contact with the lid 12, the heat from the lid 12 is transferred to the bottom portion 62 and the discharge member 70. That is, the lid 12 includes a temperature adjuster (not illustrated) configured to adjust the temperature of the lid 12 under the control of the controller 90, so that the temperatures of the source gas, the reaction gas, or the like supplied to the processing chamber 10 are adjustable. Each of the heat transfer protrusions 65 is formed of a material having high thermal conductivity, and has a circular column shape. The heat transfer protrusions 65 may be integrally formed of the same material as the outer edge portion 61 and the bottom portion 62. Because each of the heat transfer protrusions 65 makes contact with the temperature controlled lid 12, it is possible to smoothly transfer the temperature of the lid 12.

Each fixing cylinder 66 provides a structure for screwing the diffusion chamber member 60 and the lid 12 together, and a screw hole 661 is formed inside each fixing cylinder 66. The fixing cylinders 66 are distributed in the horizontal direction inside the second diffusion chamber recess 60*b*. Thus, the diffusion chamber member 60 can be fixed with a substantially uniform fastening force in an in-plane direction (the horizontal direction) with respect to the lid 12, and the airtightness and heat transfer properties can further be improved.

The diffusion chamber member 60 has a plurality of communication holes 622 for causing the reaction gas supplied to the second diffusion chamber 54 (the second diffusion chamber recess 60*b*) to flow to the bottom portion 62 between the outer edge portion 61 and the partition wall 63. Each of the communication holes 622 is disposed between the supply cylinders 64, between the heat transfer protrusions 65, and between the fixing cylinders 66, and the number of the communication holes 622 is greater than a total number of the supply cylinders 64, the heat transfer protrusions 65, and the fixing cylinders 66. A diameter of each of the communication holes 622 is smaller than the diameter of each of the central holes 621. Because the communication holes 622 are formed in large numbers and have small diameters, the reaction gas can flow out from the communication holes 622 while being sufficiently diffused in the second diffusion chamber 54.

As illustrated in FIG. 3, the diffusion chamber member 60 has a first diffusion chamber recess 60a formed in a surface thereof on the lower side in the vertical direction. The first diffusion chamber recess 60a forms the first diffusion chamber 53 when the diffusion chamber member 60 is fixed (sealed) to the discharge member 70. The first diffusion chamber recess 60a is formed by an outer edge portion 67 of the diffusion chamber member 60 having an annular shape and surrounding the first diffusion chamber recess 60a, and the bottom portion 62 described above. A lower surface (a protruding end surface) of the outer edge portion 67 is formed to have a flat shape that can make surface contact with the discharge member 70. Although not illustrated, the outer edge portion 67 is also provided with a plurality of screw holes along a circumferential direction thereof, and the plurality of screw holes are used for screwing the outer edge portion 67 and the discharge member 70 together. In addition, a sealing member (not illustrated) may be disposed between the outer edge portion 67 and the discharge member 70, and the airtightness may be improved by interposing the sealing member between the outer edge portion 67 and the discharge member 70. Alternatively, the diffusion chamber member 60 and the discharge member 70 may be integrated by a coupling means or part, such as welding or the like.

Further, the diffusion chamber member 60 includes a plurality of passage cylinders 68 provided on the bottom portion 62 inside the first diffusion chamber recess 60a. The passage cylinders 68 stand from the bottom portion 62 and are formed to have the same height as a lower surface of the outer edge portion 67 from the bottom portion 62, respectively (the heights thereof are the same). Accordingly, in a state where the discharge member 70 and the outer edge portion 67 make contact with each other, each of the passage cylinders 68 makes contact with an upper surface of the discharge member 70.

Each of the passage cylinders 68 provides a structure which is isolated from the first diffusion chamber 53 and guides the reaction gas in the second diffusion chamber 54 to the discharge member 70. The passage cylinders 68 are arranged at predetermined intervals from one another inside the first diffusion chamber recess 60a. The source gas introduced into the first diffusion chamber recess 60a is diffused to spread around each of the passage cylinders 68. The passage cylinders 68 are disposed in a matrix arrangement in which a plurality of passage cylinders 68 are arranged in a first direction and a plurality of passage cylinders 68 are arranged in a second direction perpendicular to the first direction, for example. The arrangement of the passage cylinders 68 is not limited to the illustrated example, and may be designed arbitrarily.

The plurality of the passage cylinders 68 includes cylinders (hereinafter referred to as central cylinders 681) having the central hole 621 therein, and cylinders (hereinafter referred to as outflow cylinders 682) having the communication hole 622 therein.

The plurality of central cylinders 681 are provided at the central portion of the first diffusion chamber recess 60a, and are disposed at positions overlapping the supply chamber recess 63a located on the opposite side (the upper side in the vertical direction). The central hole 621 of each central cylinder 681 penetrates the central cylinder 681 in the vertical direction, and communicates with the supply chamber recess 63a (central supply chamber 55) located on the opposite side. In addition, because the diameter of the central hole 621 of each central cylinder 681 is formed to have the diameter greater than the diameter of the communication hole 622 as described above, it is possible to cause the cleaning gas to flow smoothly.

The plurality of outflow cylinders 682 are provided in the periphery of the central cylinders 681, and are disposed at positions overlapping the second diffusion chamber recess 60b located on the opposite side. The communication hole 622 of each of the outflow cylinders 682 penetrates the outflow cylinder 682 in the vertical direction, and communicates with the second diffusion chamber recess 60b (the second diffusion chamber 54) located on the opposite side.

The supply hole 641 of each supply cylinder 64 of the second diffusion chamber recess 60b communicates with a bottom portion of the first diffusion chamber recess 60a. The supply holes 641 are provided near the central cylinders 681 according to the arrangement of the supply cylinders 64. The first diffusion chamber recess 60a diffuses the source gas flowing therein from the supply holes 641 in the horizontal direction, so that the source gas can be discharged uniformly through the discharge member 70.

Returning to the description of FIG. 1, the discharge member 70 of the shower head 50 is formed to have a disk shape thinner than the diffusion chamber member 60. The discharge member 70 has an upper surface forming a bonding surface which makes contiguous contact with the diffusion chamber member 60, and a lower surface opposing the placement surface 21s of the susceptor 21 inside the processing chamber 10. The lower surface of the discharge member 70 serves as a discharge surface 70s for discharging gas.

The discharge surface 70s of the discharge member 70 includes a plurality of first discharge ports 71 for discharging the source gas, a plurality of second discharge ports 73 for discharging the reaction gas, and a plurality of third discharge ports 75 for discharging the cleaning gas.

The first discharge ports 71 communicate with first passages 72 extending in the thickness direction inside the discharge member 70, respectively. The first passages 72 communicate with the first diffusion chamber 53 formed between the diffusion chamber member 60 and the discharge member 70, respectively, at the upper surface of the discharge member 70. Each first passage 72 is disposed between the passage cylinders 68 of the first diffusion chamber 53 (for example, at an intermediate position between the passage cylinders 68 disposed in a matrix arrangement and located adjacent to each other). Thus, the first passages 72 are also disposed in a matrix arrangement. The first passages 72 enable the source gas supplied to the first diffusion chamber 53 to pass therethrough, so that the source gas is discharged from the first discharge ports 71.

The second discharge ports 73 communicate with second passages 74 extending in the thickness direction inside the discharge member 70, respectively. The second passages 74 communicate with the communication holes 622 of the plurality of outflow cylinders 682 (portions of the passage cylinders 68), respectively, at the upper surface of the discharge member 70. The second passages 74 are disposed in a matrix arrangement corresponding to a matrix arrangement of the outflow cylinders 682. A diameter of each second passage 74 is set to be smaller than the diameter of each communication hole 622. Accordingly, when assembling the diffusion chamber member 60 and the discharge member 70, the communication holes 622 and the second passages 74 can communicate with each other in a stable manner, respectively. The communication holes 622 and the second passages 74 enable the reaction gas supplied to the second diffusion chamber 54 to pass therethrough, so that the reaction gas is discharged from the second discharge ports 73.

The third discharge ports 75 communicate with third passages 76 extending in the thickness direction inside the discharge member 70, respectively. The third passages 76 communicate with the central holes 621 of the plurality of central cylinders 681 (portions of the passage cylinders 68), respectively, at the upper surface of the discharge member 70. The third passages 76 are disposed in a matrix arrangement corresponding to a matrix arrangement of the central cylinders 681. A diameter of each third passage 76 is set to be smaller than or equal to the diameter of each central hole 621. Accordingly, when assembling the diffusion chamber member 60 and the discharge member 70, the central holes 621 and the third passages 76 can communicate with each other in a stable manner, respectively. However, the diameter of the third passage 76 may be greater than the diameter of the first passage 72 or the diameter of the second passage 74. Thus, the central holes 621 and the third passages 76 can pass the radicalized cleaning gas in the central supply chamber 55 without deactivating the radicalized cleaning gas.

The introduction structure 52 of the shower head 50 has a function of distributing the source gas and the reaction gas to a plurality of locations on the upper surface of the lid 12. The lid 12 includes a plurality of first lid-side flow passages 12a communicating with the supply holes 641 in the supply cylinders 64 of the main structure 51, and the plurality of second lid-side flow passages 12b communicating with the second diffusion chamber 54. Each first lid-side flow passage 12a is provided at a position near the introduction pipe 336 at the central portion of the lid 12, and each second lid-side flow passage 12b is provided at a position on an outer side of the first lid-side flow passage 12a in a radial direction.

Figure 4:
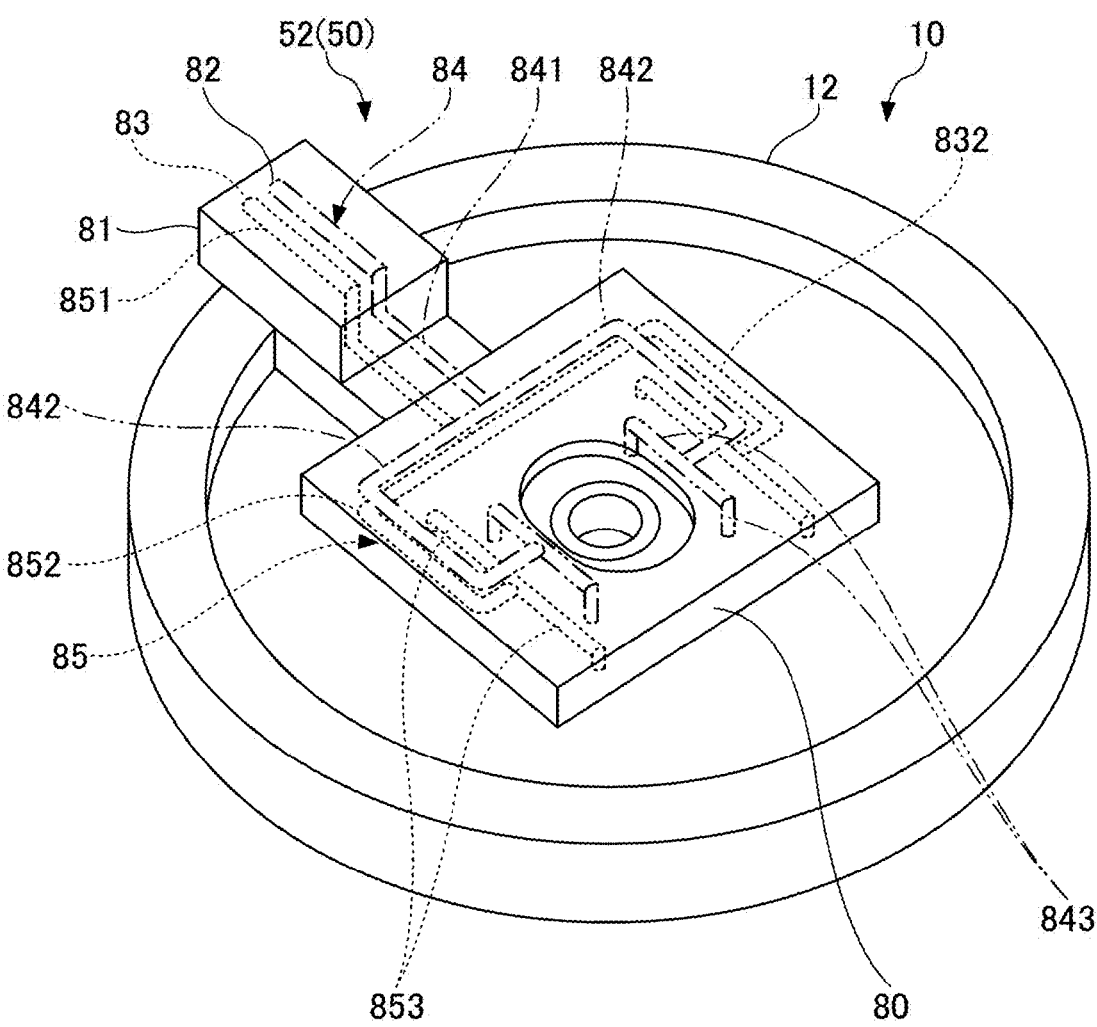
FIG. 4 is a perspective view illustrating a lid and an introduction structure.

The introduction structure 52 supplies the source gas to each first lid-side flow passage 12a, and supplies the reaction gas to each second lid-side flow passage 12b. Next, the configuration of the introduction structure 52 will be described with reference to FIG. 4. FIG. 4 is a perspective view illustrating the lid 12 and the introduction structure 52.

The introduction structure 52 is fixed so as to surround a periphery of the introduction pipe 336 that is provided at the central portion of the lid 12 and supplies the cleaning gas. The introduction structure 52 has a central portion 80 formed on the lid 12 in a substantially rectangular shape in the plan view, and a connecting portion 81 continuing from the central portion 80 and extending outward in the radial direction.

The introduction structure 52 includes a source gas introduction port 82 and a reaction gas introduction port 83 that are provided in an outwardly extending end portion of the connecting portion 81. A pipe of the source gas supply passage 311 (refer to FIG. 1) of the gas supply 30 is connected to the source gas introduction port 82. A pipe of the reaction gas supply passage 321 (refer to FIG. 1) of the gas supply 30 is connected to the reaction gas introduction port 83. A first flow passage 84 communicating with the source gas introduction port 82 and through which the source gas flows, and a second flow passage 85 communicating with the reaction gas introduction port 83 and through which the reaction gas flows, are provided inside the central portion 80 and the connecting portion 81 of the introduction structure 52.

The first flow passage 84 has a first integrated flow passage 841 extending inside the connecting portion 81. In addition, the first flow passage 84 has two first branching flow passages 842 that branch from the first integrated flow passage 841 at the central portion 80. The first branching flow passages 842 extend so as to go around the introduction pipe 336, and the first flow passage 84 has two first detailed branching flow passages 843 that branch from each first branching flow passage 842 near the introduction pipe 336. The two first branching flow passages 842 are formed to have mutually the same flow passage shape (including a length and a cross sectional area of the flow passage), and the four first detailed branching flow passages 843 are also formed to have mutually the same flow passage shape (including a length and a cross sectional area of the flow passage). Thus, the first flow passage 84 can uniformly distribute the source gas to the four first detailed branching flow passages 843 in the periphery of the introduction pipe 336, and uniformly introduce the source gas to the four first lid-side flow passages 12a inside the lid 12.

Similarly, the second flow passage 85 has a second integrated flow passage 851 extending inside the connecting portion 81. In addition, the second flow passage 85 has two second branching flow passages 852 that branch from the second integrated flow passage 851 at the central portion 80. The second branching flow passages 852 extend so as to go around the introduction pipe 336, and the second flow passage 85 has two second detailed branching flow passages 853 that branch from each second branching flow passage 852 near the introduction pipe 336 and on the outer side of the first detailed branching flow passages 843. The two second branching flow passages 852 are formed to have mutually the same flow passage shape (including a length and a cross sectional area of the flow passage), and the four second detailed branching flow passages 853 are also formed to have mutually the same flow passage shape (including a length and a cross sectional area of the flow passage). Thus, the second flow passage 85 can uniformly distribute the reaction gas to the four second detailed branching flow passages 853 in the periphery of the introduction pipe 336, and uniformly introduce the reaction gas to the four second lid-side flow passages 12b inside the lid 12.

Figure 5:
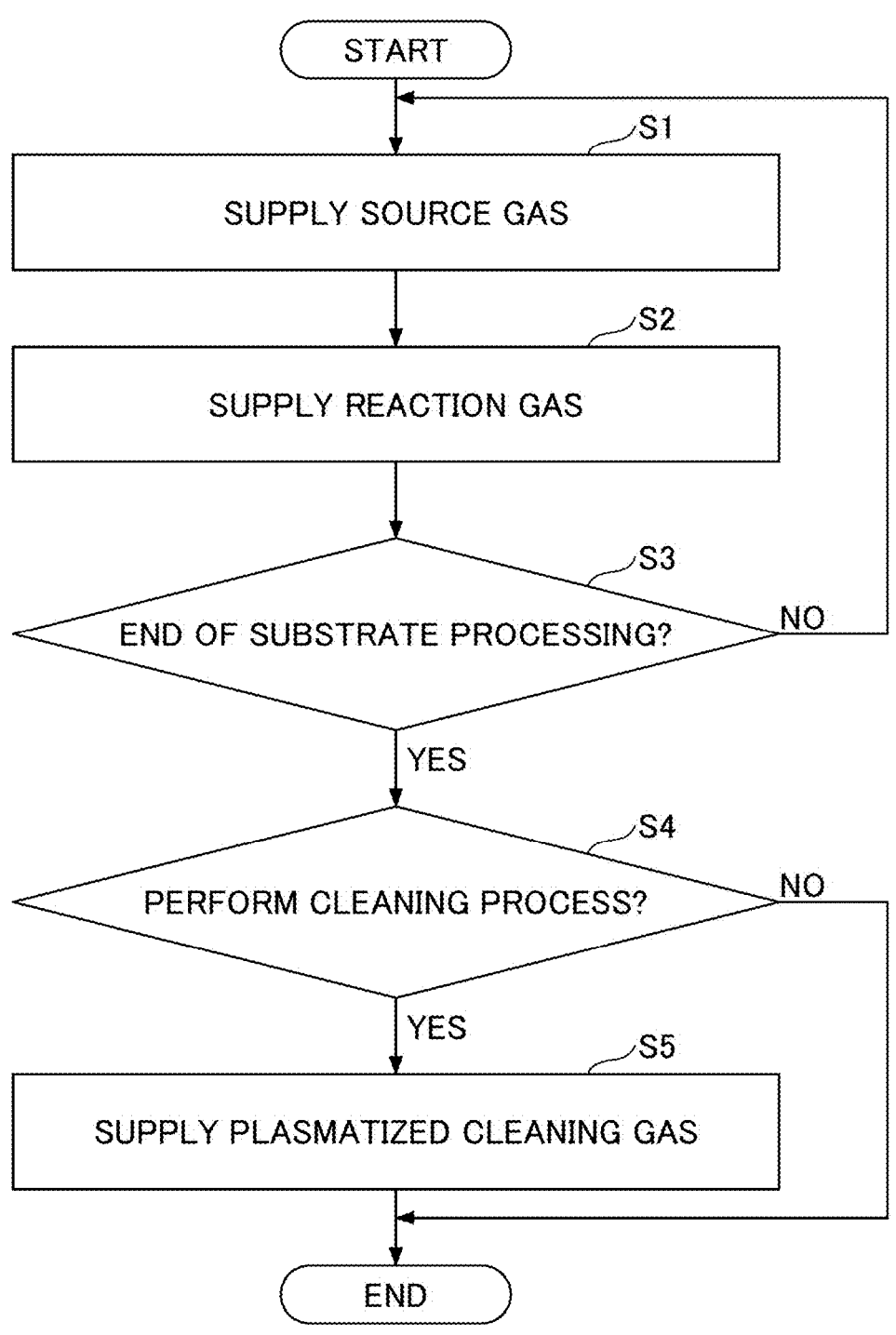
FIG. 5 is a flow chart illustrating a processing flow of a substrate processing method.

The substrate processing apparatus 1 according to the present embodiment is basically configured as described above, and the operation thereof will be described below with reference to FIG. 5. FIG. 5 is a flow chart illustrating a processing flow of a substrate processing method.

The substrate processing apparatus 1 transports the substrate W to the susceptor 21 disposed at the transport position inside the processing chamber 10, under the control of the controller 90. Thereafter, the controller 90 raises the susceptor 21 to the processing position, and forms (or deposits) a film on the substrate W by performing a film forming method (the substrate processing method).

In the substrate processing method, the controller 90 performs processes of steps S1 through S5 illustrated in FIG. 5. First, the controller 90 performs a source gas supplying process (step S1) to supply the source gas into the processing chamber 10 by controlling the gas supply 30. During the source gas supply process, the controller 90 adjusts the pressure inside the processing chamber 10 by discharging the exhaust gas inside the processing chamber 10 by the gas exhauster 40. During the source gas supply process, the controller 90 also performs processes, such as rotating the susceptor 21 by the substrate support 20, adjusting the temperature of the processing chamber 10 or the temperature of the susceptor 21 to a target temperature, or the like. The exhaust control, the rotation control, and the temperature adjustment (or control) are also performed in the same manner during subsequent processes (step S2 and subsequent steps).

The controller 90 opens the valve 313 of the source gas supply 31 to cause the source gas from the source gas source 312 to flow out to the source gas supply passage 311, and to cause the source gas to flow into the introduction structure 52 of the shower head 50 while adjusting the flow rate by the flow rate adjuster 314. In the introduction structure 52, the source gas passes through the first flow passage 84 while being branched, and flows inside the lid 12 (into each first lid-side flow passage 12*a*).

Figure 6A:
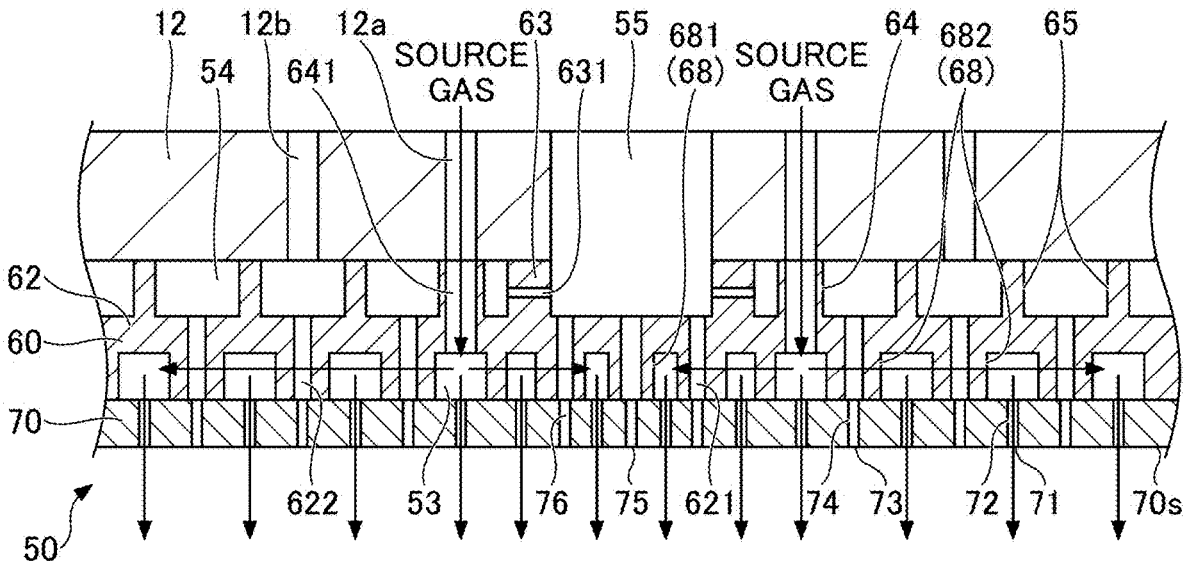
FIG. 6A is an enlarged cross sectional view illustrating a gas flow in a main structure of the shower head during a source gas supply process.

FIG. 6A is an enlarged cross sectional view illustrating a gas flow in the main structure 51 of the shower head 50 during the source gas supply process. As illustrated in FIG. 6A, the source gas flows into the supply hole 641 of each supply cylinder 64 of the main structure 51 from each first lid-side flow passage 12*a* of the lid 12. Each supply cylinder 64 makes airtight contact with the lid 12, and is thus isolated from the second diffusion chamber 54, thereby making it possible to prevent the source gas from leaking into the second diffusion chamber 54. Further, the source gas flows into the first diffusion chamber 53 formed between the diffusion chamber member 60 and the discharge member 70, through the supply holes 641.

In the first diffusion chamber 53, the source gas flows between the plurality of passage cylinders 68 and diffuses in the horizontal direction. When the source gas flows into the first passages 72 of the discharge member 70 communicating with the first diffusion chamber 53, the source gas is discharged into the processing space PS from the first discharge ports 71 of the discharge surface 70*s* through the first passages 72. The shower head 50 can uniformly discharge the source gas from the first discharge ports 71 of the discharge surface 70*s* by circulating the source gas as described above. As a result, the source gas discharged into the processing space PS is uniformly supplied with respect to the entire surface of the substrate W disposed below the shower head 50 in the vertical direction, and is adsorbed onto the surface of the substrate W. When the source gas supply process is performed for a preset period of time, the controller 90 ends the source gas supply process.

Returning to the description of FIG. 5, the controller 90 next performs a reaction gas supplying process (step S2) to supply the reaction gas into the processing chamber 10 by controlling the gas supply 30. The controller 90 opens the valve 323 of the reaction gas supply 32 to cause the reaction gas from the reaction gas source 322 to flow out to the reaction gas supply passage 321, and to cause the reaction gas to flow into the introduction structure 52 of the shower head 50 while adjusting the flow rate by the flow rate adjuster 324. In the introduction structure 52, the reaction gas passes through the second flow passage 85 while being branched, and flows inside the lid 12 (into each second lid-side flow passage 12*b*).

Figure 6B:
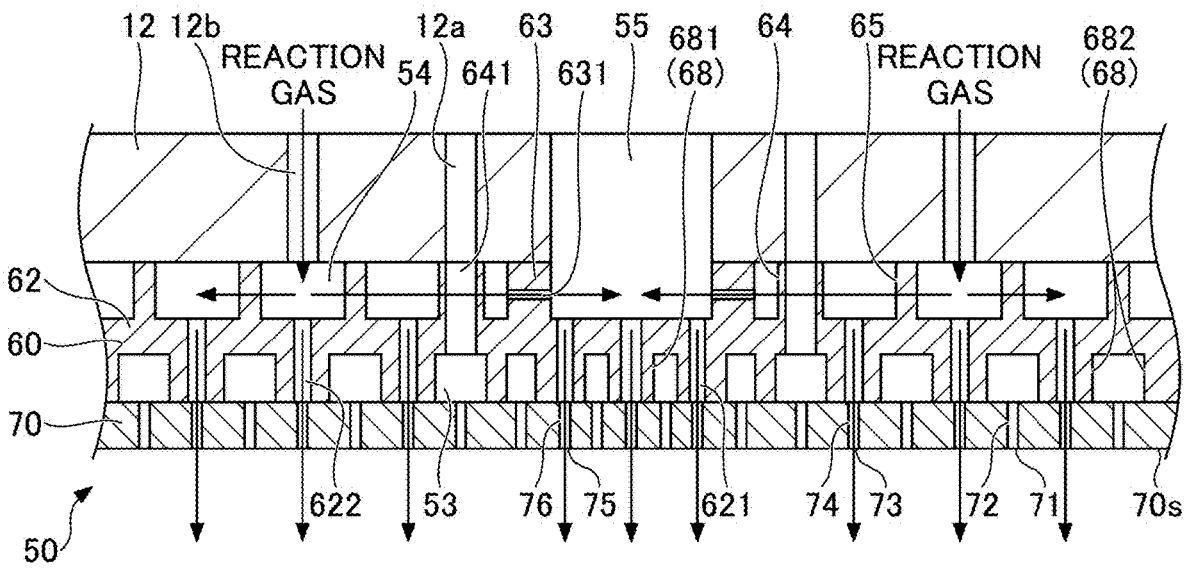
FIG. 6B is an enlarged cross sectional view illustrating the gas flow in the main structure of the shower head during a reaction gas supply process.

FIG. 6B is an enlarged cross sectional view illustrating a gas flow in the main structure 51 of the shower head 50 during the reaction gas supply process. As illustrated in FIG. 6B, the reaction gas flows into the second diffusion chamber 54 between the lid 12 and the diffusion chamber member 60 from each second lid-side flow passage 12*b* of the lid 12. In the second diffusion chamber 54, the reaction gas flows between the supply cylinders 64, the heat transfer protrusions 65, and the fixing cylinders 66, and diffuses in the horizontal direction. Further, the reaction gas flows into the communication holes 622 communicating with the second diffusion chamber 54.

The reaction gas that flows into the communication holes 622 passes through the passage cylinders 68 (the outflow cylinders 682) on the side of the second diffusion chamber 54. Each outflow cylinder 682 makes airtight contact with the discharge member 70, and is thus isolated from the first diffusion chamber 53, thereby making it possible to prevent the reaction gas from leaking into the first diffusion chamber 53. The reaction gas is discharged into the processing space PS from the second discharge ports 73 of the discharge surface 70*s* through the second passages 74.

Further, a part of the reaction gas diffused in the second diffusion chamber 54 also moves to the central supply chamber 55 through the horizontal holes 631 in the partition wall 63. The reaction gas moved to the central supply chamber 55 further flows into each of the central holes 621, and passes inside each of the passage cylinders 68 (each of the central cylinders 681) on the side of the second diffusion chamber 54. Each central cylinder 681 also makes airtight contact with the discharge member 70, and is thus isolated from the first diffusion chamber 53, thereby making it possible to prevent the reaction gas from leaking into the first diffusion chamber 53. Further, the reaction gas is discharged into the processing space PS from each of the third discharge ports 75 of the discharge surface 70*s* through each of the third passages 76.

Accordingly, by discharging the reaction gas from the second discharge ports 73 and the third discharge ports 75 of the discharge surface 70*s*, the shower head 50 can uniformly supply the reaction gas with respect to the entire surface of the substrate W disposed below the shower head 50 in the vertical direction. The reaction gas reacts with the source gas adsorbed on the substrate W, thereby appropriately reforming the source gas. When the reaction gas supply process is performed for a preset period of time, the controller 90 ends the reaction gas supply process.

Returning to the description of FIG. 5, after the reaction gas supplying process, the controller 90 determines whether or not to end the substrate processing (step S3). For example, the controller 90 counts a number of times the substrate processing (the source gas supply process and the reaction gas supply process) is performed, and determines whether or not the substrate processing is performed a number of times corresponding to a recipe. When the substrate processing is to be continued (NO in step S3), the process returns to the process of step S1 and the same processing is repeated. On the other hand, when the substrate processing is to be ended (YES in step S3), the process advances to a process of step S4.

The controller 90 determines whether or not to perform a cleaning process in the processing chamber 10 (step S4). For example, the controller 90 prestores a threshold value for the period of time of the substrate processing for performing the cleaning process, and determines that the cleaning process is to be performed when a total processing time of the substrate processing reaches the threshold value. In a case where the controller 90 determines that the cleaning process is to be performed (YES in step S4), the process advances to a process of step S5. On the other hand, in a case where the controller 90 determines that the cleaning process is not to be performed (NO in step S4), the process skips the process of step S5, and the process ends.

During the cleaning process (step S5), the controller 90 opens the valve 333 of the cleaning gas supply 33 to cause the cleaning gas from the cleaning gas source 332 to flow out to the cleaning gas supply passage 331, and to supply the cleaning gas into the remote plasma device 335 while adjusting the flow rate by the flow rate adjuster 334. The remote plasma device 335 generates plasma under the control of the controller 90, so as to radicalize the cleaning gas. The radicalized cleaning gas flows inside the lid 12 through the introduction pipe 336 on a downstream side of the remote plasma device 335, and flows into the central supply chamber 55 of the shower head 50. The process ends after the process of step S5.

Figure 7:
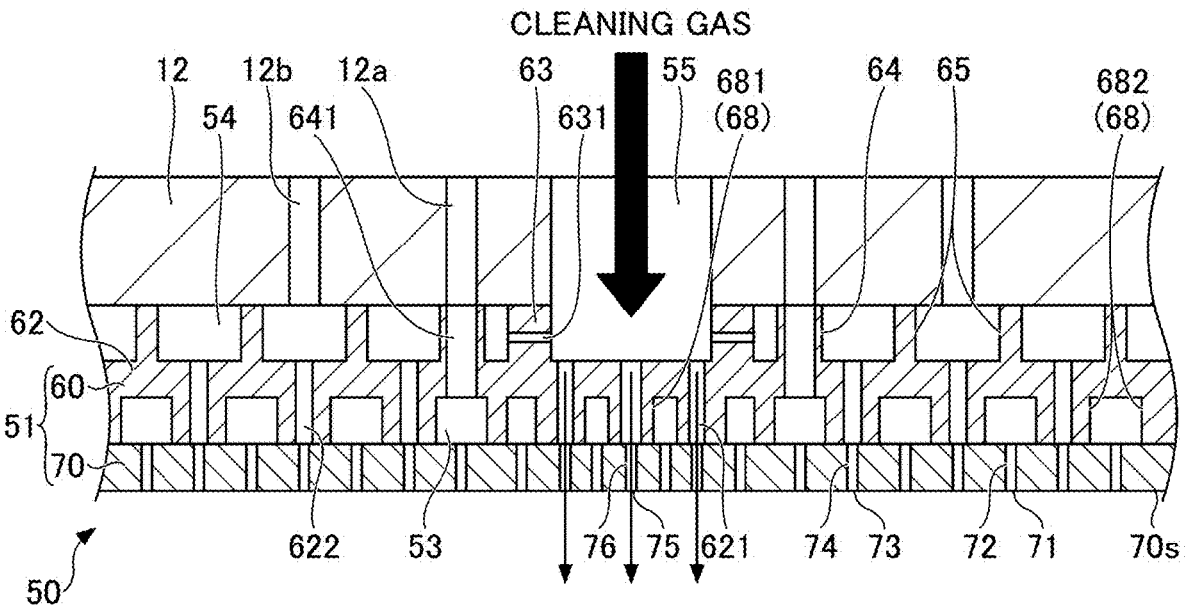
FIG. 7 is an enlarged cross sectional view illustrating the gas flow in the main structure during a cleaning process.

FIG. 7 is an enlarged cross sectional view illustrating the gas flow in the main structure 51 during the cleaning process. As illustrated in FIG. 7, the cleaning gas that flows into the central supply chamber 55 moves downward inside the central supply chamber 55 in the vertical direction, flow into each of the central holes 621, and passes inside each of the passage cylinders 68 (each of the central cylinders 681). Further, the cleaning gas is discharged into the processing space PS from each of the third discharge ports 75 of the discharge surface 70s through each of the third passages 76.

The radicalized cleaning gas flows linearly through the shower head 50, and is discharged from the central portion of the discharge surface 70s. In this state, the central supply chamber 55, the central holes 621, and the third passages 76 significantly reduce deactivation of the radicalized cleaning gas, and guide the radicalized cleaning gas to the processing space PS. The radicalized cleaning gas is diffused in the radial direction from the central portion of the processing space PS. In the processing chamber 10, a large amount of residue of the source gas and the reaction gas remains at the central portion, and the central portion having the large amount of residue can be cleaned effectively by supplying the radicalized cleaning gas to the central portion. In particular, each central hole 621 is formed to have the diameter greater than the diameter of each communication hole 622, and thus, it is possible to reduce the possibility of the radicalized cleaning gas making contact with the shower head 50 and deactivating the radicalized cleaning gas.

In addition, when the cleaning gas is supplied to the central supply chamber 55, the reaction gas stagnates in the second diffusion chamber 54 due to the closing of the valve 323 of the reaction gas supply passage 321, thereby preventing the cleaning gas from flowing into the second diffusion chamber 54 through the horizontal holes 631. Even if the cleaning gas were to flow into the second diffusion chamber 54, the amount of the cleaning gas would be small, and the radicalized cleaning gas would be deactivated. During the cleaning process, the controller 90 may adjust an internal pressure of the second diffusion chamber 54 to become higher than or equal to an internal pressure of the central supply chamber 55, by supplying the purge gas or the like to the second diffusion chamber 54. Accordingly, the cleaning gas can be prevented from flowing into the second diffusion chamber 54.

As described above, the substrate processing apparatus 1 can improve a film thickness distribution of the film formed on the substrate W, by uniformly supplying the source gas and the reaction gas. In addition, because the first diffusion chamber 53 and the second diffusion chamber 54 are separated from each other in the substrate processing apparatus 1, the discharge of the source gas from the first diffusion chamber 53 and the discharge of the reaction gas from the second diffusion chamber 54 can be made powerfully, thereby preventing back diffusion and eliminating residue of the source gas and the reaction gas. Further, the substrate processing apparatus 1 can supply the radicalized cleaning gas to the processing space PS substantially without deactivating the cleaning gas, and thus, a cleaning time of the cleaning process can be shortened.

The substrate processing apparatus 1, the shower head 50, and the substrate processing method are not limited to those of the embodiment described above, and various modifications may be made thereto. For example, although the source gas is supplied to the first diffusion chamber 53 and the reaction gas is supplied to the second diffusion chamber 54 in the embodiment described above, the shower head 50 may supply the gases to opposite destinations. That is, the substrate processing apparatus 1 may supply the reaction gas to the first diffusion chamber 53 and supply the source gas to the second diffusion chamber 54.

In addition, the shower head 50 may include a single large opening (the third discharge port 75) at the central portion of the discharge surface 70s, and the cleaning gas may be supplied directly from the central supply chamber 55 to the single large opening (without passing through a plurality of holes), for example.

Technical concepts and effects of the embodiment of the present disclosure described above will be explained in the following.

The shower head 50 according to a first aspect of the present disclosure includes the structure (the main structure 51), the first diffusion chamber 53, the second diffusion chamber 54, the plurality of cylinders (the outflow cylinders 682), the plurality of first discharge ports 71, the plurality of second discharge ports 73, the central supply chamber 55, and one or more third discharge ports 75. The first diffusion chamber 53 spreads in the direction perpendicular to the thickness direction of the structure inside the structure of the shower head 50, and is configured to diffuse the first gas (the source gas). The second diffusion chamber 54 is adjacent to the first diffusion chamber 53 in the thickness direction inside the structure but is provided independently of the first diffusion chamber 53, and are configured to diffuse the second gas (the reaction gas). The plurality of cylinders (the outflow cylinders 682) are disposed in the first diffusion chamber 53 and have the communication holes 622 on the inner sides thereof communicating with the second diffusion chamber 54. The plurality of first discharge ports 71 are provided in the discharge surface 70s of the structure, communicate with the first diffusion chamber 53, and are configured to discharge the first gas. The plurality of second discharge ports 73 are provided in the discharge surface 70s at positions different from the first discharge ports 71, communicate with the communication holes 622 of the plurality of cylinders, and are configured to discharge the second gas. The central supply chamber 55 is provided separately from the first diffusion chamber 53 and the second diffusion chamber 54 at the central portion of the structure in the direction perpendicular to the thickness direction, and is configured to supply the radicalized third gas (the radicalized cleaning gas). The one or more third discharge ports 75 are provided at the central portion of the discharge surface 70s, communicate with the central supply chamber 55, and are configured to discharge the third gas.

According to the configuration described above, the shower head 50 can smoothly discharge the radicalized third gas (the radicalized cleaning gas) from the central portion, and reduce the deactivation of the radicalized third gas. Thus, the shower head 50 can stably supply the radicalized third gas to the target. For example, when the cleaning process is performed to clean the interior of the processing chamber 10 using the radicalized third gas, the radicalized third gas can satisfactorily remove the residue inside the processing chamber 10, and it is possible to efficiently perform the cleaning process.

In addition, the structure (the main structure 51) includes the central supply chamber 55 disposed at the position adjacent to the second diffusion chamber 54, and the partition wall 63 that separates the second diffusion chamber 54 and the central supply chamber 55 from each other. Hence, the shower head 50 has a structure in which the first diffusion chamber 53, the second diffusion chamber 54, and the central supply chamber 55 are appropriately partitioned from one another, and it is possible to stably supply the second gas and the third gas.

Moreover, the partition wall 63 has one or more horizontal holes 631 that communicate the second diffusion chamber 54 and the central supply chamber 55 to each other. Thus, the shower head 50 can cause the second diffusion chamber 54 to communicate with the central supply chamber 55, and discharge the second gas from the third discharge ports 75 by supplying the second gas inside the second diffusion chamber 54 to the central supply chamber 55. As a result, it is possible to improve an in-plane uniformity of the substrate processing.

Further, the central supply chamber 55 communicates with the central holes 621 of the plurality of central cylinders 681 disposed inside the first diffusion chamber 53, and the diameter of the central holes 621 of the plurality of central cylinders 681 is greater than the diameter of the communication holes 622 of the plurality of cylinders (the outflow cylinders 682). Thus, the shower head 50 can discharge the radicalized third gas from the third discharge ports 75 while preventing the radicalized third gas from being deactivated in the central holes 621.

The structure (the main structure 51) is formed by laminating the diffusion chamber member 60 fixed to the member (the lid 12) through which the first gas, the second gas, and the third gas pass, and the discharge member 70 fixed to the diffusion chamber member 60 and having the discharge surface 70s. Accordingly, the shower head 50 can easily form the first diffusion chamber 53, the second diffusion chamber 54, and the central supply chamber 55 inside the structure.

The diffusion chamber member 60 has the first diffusion chamber recess 60a forming the first diffusion chamber 53 in one surface thereof, and the second diffusion chamber recess 60b forming the second diffusion chamber 54 in the other surface thereof. Thus, the shower head 50 can easily form each of the first diffusion chamber 53 and the second diffusion chamber 54 by laminating the lid 12, the diffusion chamber member 60, and the discharge member 70.

In addition, the diffusion chamber member 60 has the first diffusion chamber recess 60a in one surface thereof opposing the discharge member 70, and has the second diffusion chamber recess 60b in the other surface thereof opposing the member (the lid 12) through which the first gas, the second gas, and the third gas pass. Accordingly, when assembling the diffusion chamber member 60 and the discharge member 70, the shower head 50 can be configured to have the first diffusion chamber 53 close to the discharge member 70 and the second diffusion chamber 54 at a position separated from the discharge member 70.

Moreover, the diffusion chamber member 60 includes the plurality of cylinders (the outflow cylinders 682) in the first diffusion chamber recess 60a, and includes the plurality of supply cylinders 64 having the supply holes 641 communicating with the first diffusion chamber 53 and supplying the first gas to the first diffusion chamber 53 in the second diffusion chamber recess 60b. Hence, the shower head 50 can smoothly supply the first gas to the first diffusion chamber 53, and smoothly supply the second gas to the second diffusion chamber 54.

Further, the structure (the main structure 51) includes the plurality of heat transfer protrusions 65 that transfer heat to the bottom portion 62 that separates the first diffusion chamber 53 and the second diffusion chamber 54. Thus, the shower head 50 can effectively adjust the temperature on the side of the discharge surface 70s, and improve the in-plane uniformity of the substrate processing and the cleaning process, for example.

The substrate processing apparatus 1 according to a second aspect of the present disclosure includes the processing chamber 10 configured to perform a process on the substrate W, the gas supply 30 configured to supply the plurality of kinds of gases to the processing chamber 10, and the shower head 50 connected to the gas supply 30 and configured to discharge each of the plurality of kinds of gases into the processing chamber 10. The shower head 50 includes the structure (the main structure 51), the first diffusion chamber 53, the second diffusion chamber 54, the plurality of cylinders (the outflow cylinders 682), the plurality of first discharge ports 71, the plurality of second discharge ports 73, the central supply chamber 55, and one or more third discharge ports 75. The first diffusion chamber 53 spreads in the direction perpendicular to the thickness direction of the structure inside the structure of the shower head 50, and is configured to diffuse the first gas (the source gas). The second diffusion chamber 54 is adjacent to the first diffusion chamber 53 in the thickness direction inside the structure but is provided independently of the first diffusion chamber 53, and is configured to diffuse the second gas (the reaction gas). The plurality of cylinders (the outflow cylinders 682) are disposed in the first diffusion chamber 53 and have the communication holes 622 on the inner sides thereof communicating with the second diffusion chamber 54. The plurality of first discharge ports 71 are provided in the discharge surface 70s of the structure, communicate with the first diffusion chamber 53, and are configured to discharge the first gas. The plurality of second discharge ports 73 are provided in the discharge surface 70s at positions different from the first discharge ports 71, communicate with the communication holes 622 of the plurality of cylinders, and are configured to discharge the second gas. The central supply chamber 55 is provided separately from the first diffusion chamber 53 and the second diffusion chamber 54 at the central portion of the structure in the direction perpendicular to the thickness direction, and is configured to supply the radicalized third gas (the radicalized cleaning gas). The one or more third discharge ports 75 are provided at the central portion of the discharge surface 70s, communicate with the central supply chamber 55, and are configured to discharge the third gas.

The substrate processing method according to a third aspect of the present disclosure is for the substrate processing apparatus 1 including the processing chamber 10 configured to perform a process on the substrate W, the gas supply 30 configured to supply the plurality of kinds of gases to the processing chamber 10, and the shower head 50 connected to the gas supply 30 and configured to discharge each of the plurality of kinds of gases into the processing chamber 10. The substrate processing method includes diffusing the first gas in the first diffusion chamber 53 spreading in the direction perpendicular to the thickness direction of the structure (main structure 51) of the shower head 50 inside the structure, and discharging the first gas from the plurality of first discharge ports 71 that are provided in the discharge surface 70s of the structure and communicate with the first diffusion chamber 53; diffusing the second gas in the second diffusion chamber 54 that is adjacent to the first diffusion chamber 53 in the thickness direction inside the structure but is provided independently of the first diffusion chamber 53, and discharging the second gas from the plurality of second discharge ports 73 provided in the discharge surface 70s at positions different from the first discharge ports 71 and communicating with the communication holes 622 of the plurality of cylinders (the outflow cylinders 682) disposed in the first diffusion chamber 53, via the communication holes 622; and supplying the radicalized third gas into the central supply chamber 55 provided separately from the first diffusion chamber 53 and the second diffusion chamber 54 at the central portion of the structure in the direction perpendicular to the thickness direction, and discharging the radicalized third gas from one or more third discharge ports 75 communicating with the central supply chamber 55 provided at the central portion of the discharge surface 70s. According to the second aspect and the third aspect of the present disclosure, it is possible to reduce the deactivation of the radicalized third gas.

The shower head 50, the substrate processing apparatus 1, and the substrate processing method according to the embodiment disclosed herein are merely examples in all respects and are non-limiting. The embodiment can be modified and improved in various forms without departing from the scope and spirit of the present disclosure. The features described in the embodiments can be modified or combined within a range not inconsistent with each other.

The substrate processing apparatus 1 according to the present disclosure may be applied to any type of apparatus, such apparatuses employing chemical vapor deposition (CVD), atomic layer deposition (ALD), capacitively coupled plasma (CCP), inductively coupled plasma (ICP), radial line slot antenna (RLSA), an electron cyclotron resonance plasma (ECR), helicon wave plasma (HWP), or the like.

According to embodiments of the present disclosure, it is possible to reduce deactivation of the radicalized gas.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A shower head comprising:
a structure;
a first diffusion chamber, spreading inside the structure in a direction perpendicular to a thickness direction of the structure, configured to diffuse a first gas;
a second diffusion chamber, provided inside the structure adjacent to the first diffusion chamber in the thickness direction and independent of the first diffusion chamber, configured to diffuse a second gas;
a plurality of cylinders disposed in the first diffusion chamber and having communication holes on inner sides thereof communicating with the second diffusion chamber;

a plurality of first discharge ports, provided in a discharge surface of the structure and communicating with the first diffusion chamber, and configured to discharge the first gas;
a plurality of second discharge ports, provided in the discharge surface at positions different from the first discharge ports and communicating with the communication holes of the plurality of cylinders, and configured to discharge the second gas;
a central supply chamber, provided separately from the first diffusion chamber and the second diffusion chamber at a central portion of the structure in the direction perpendicular to the thickness direction, and configured to supply a radicalized third gas; and
one or more third discharge ports, provided in a central portion of the discharge surface and communicating with the central supply chamber, and configured to discharge the third gas, wherein:
the structure has the central supply chamber disposed at a position adjacent to the second diffusion chamber, and a partition wall partitioning the central supply chamber from the second diffusion chamber, and
the partition wall includes one or more horizontal holes communicating the second diffusion chamber with the central supply chamber.

2. The shower head as claimed in claim 1, wherein:
the central supply chamber communicates with central holes of a plurality of central cylinders disposed in the first diffusion chamber, and
a diameter of the central holes of the plurality of central cylinders is greater than a diameter of the communication holes of the plurality of cylinders.

3. The shower head as claimed in claim 1, wherein the structure has a laminated configuration including:
a diffusion chamber member fixed to a member through which the first gas, the second gas, and the third gas pass; and
a discharge member fixed to the diffusion chamber member and having the discharge surface.

4. The shower head as claimed in claim 3, wherein the diffusion chamber member has a first diffusion chamber recess forming the first diffusion chamber in a first surface thereof, and a second diffusion chamber recess forming the second diffusion chamber in a second surface thereof.

5. The shower head as claimed in claim 4, wherein the diffusion chamber member includes:
the first diffusion chamber recess in the first surface opposing the discharge member; and
the second diffusion chamber recess in the second surface opposing the member through which the first gas, the second gas, and the third gas pass.

6. The shower head as claimed in claim 4, wherein the diffusion chamber member includes:
the plurality of cylinders in the first diffusion chamber recess; and
a plurality of supply cylinders, having supply holes communicating with the first diffusion chamber to supply the first gas to the first diffusion chamber, in the second diffusion chamber recess.

7. The shower head as claimed in claim 1, wherein the structure includes a plurality of heat transfer protrusions configured to transfer heat to a bottom portion that separates the first diffusion chamber and the second diffusion chamber.

8. A substrate processing apparatus comprising:
a processing chamber configured to perform a process on a substrate;

a gas supply configured to supply a plurality of kinds of gases to the processing chamber; and a shower head connected to the gas supply and configured to discharge each of the plurality of kinds of gases into the processing chamber, wherein the shower head includes:

a structure;

a first diffusion chamber, spreading inside the structure in a direction perpendicular to a thickness direction of the structure, configured to diffuse a first gas;

a second diffusion chamber, provided inside the structure adjacent to the first diffusion chamber in the thickness direction and independent of the first diffusion chamber, configured to diffuse a second gas;

a plurality of cylinders disposed in the first diffusion chamber and having communication holes on inner sides thereof communicating with the second diffusion chamber;

a plurality of first discharge ports, provided in a discharge surface of the structure and communicating with the first diffusion chamber, and configured to discharge the first gas;

a plurality of second discharge ports, provided in the discharge surface at positions different from the first discharge ports and communicating with the communication holes of the plurality of cylinders, and configured to discharge the second gas;

a central supply chamber, provided separately from the first diffusion chamber and the second diffusion chamber at a central portion of the structure in the direction perpendicular to the thickness direction, and configured to supply a radicalized third gas; and one or more third discharge ports, provided in a central portion of the discharge surface and communicating with the central supply chamber, and configured to discharge the third gas, wherein:

the structure has the central supply chamber disposed at a position adjacent to the second diffusion chamber, and a partition wall partitioning the central supply chamber from the second diffusion chamber, and the partition wall includes one or more horizontal holes communicating the second diffusion chamber with the central supply chamber.

9. A substrate processing method for a substrate processing apparatus including a processing chamber configured to perform a process on a substrate, a gas supply configured to supply a plurality of kinds of gases to the processing chamber, and a shower head connected to the gas supply and configured to discharge each of the plurality of kinds of gases into the processing chamber, the substrate processing method comprising:

diffusing a first gas in a first diffusion chamber provided in a structure of the shower head and spreading in a direction perpendicular to a thickness direction of the structure, and discharging the first gas from a plurality of first discharge ports provided in a discharge surface of the structure and communicating with the first diffusion chamber;

diffusing a second gas in a second diffusion chamber provided adjacent to the first diffusion chamber in the thickness direction of the structure and independent of the first diffusion chamber, and discharging the second gas from a plurality of second discharge ports provided in the discharge surface at positions different from the first discharge ports and communicating with communication holes of a plurality of cylinders disposed in the first diffusion chamber; and discharging a radicalized third gas from one or more third discharge ports provided in a central portion of the discharge surface and communicating with a central supply chamber provided separately from the first diffusion chamber and the second diffusion chamber in a central portion of the structure in the direction perpendicular to the thickness direction, wherein during the diffusing of the second gas in the second diffusion chamber, the second gas diffuses through horizontal holes into the central supply chamber and into the third discharge ports, and during the discharging the radicalized third gas, the radicalized third gas does not flow into the second diffusion chamber.

* * * * *